(12) United States Patent
Quan

(10) Patent No.: US 11,309,513 B2
(45) Date of Patent: Apr. 19, 2022

(54) ANODE, LIGHT EMITTING DEVICE, DISPLAY SUBSTRATE AND METHOD OF MANUFACTURING THE SAME, AND DISPLAY DEVICE

(71) Applicant: BOE TECHNOLOGY GROUP CO., LTD., Beijing (CN)

(72) Inventor: Wei Quan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/760,644

(22) PCT Filed: Nov. 4, 2019

(86) PCT No.: PCT/CN2019/115360
§ 371 (c)(1),
(2) Date: Apr. 30, 2020

(87) PCT Pub. No.: WO2020/093974
PCT Pub. Date: May 14, 2020

(65) Prior Publication Data
US 2021/0167319 A1 Jun. 3, 2021

(30) Foreign Application Priority Data
Nov. 6, 2018 (CN) .......................... 201811314188.1

(51) Int. Cl.
*H01L 51/52* (2006.01)
*H01L 27/32* (2006.01)
*H01L 51/56* (2006.01)

(52) U.S. Cl.
CPC ...... *H01L 51/5218* (2013.01); *H01L 27/3211* (2013.01); *H01L 51/5212* (2013.01); *H01L 51/56* (2013.01)

(58) Field of Classification Search
CPC . H01L 51/5218; H01L 51/5212; H01L 51/56; H01L 51/5206; H01L 27/3241; H01L 27/3211; H01L 27/3277; H01L 2251/5315
See application file for complete search history.

(56) References Cited

U.S. PATENT DOCUMENTS

| 2005/0001963 | A1 | 1/2005 | Yokoyama |
| 2008/0258609 | A1 | 10/2008 | Nakamura |
| 2019/0207163 | A1* | 7/2019 | Paek .................. H01L 27/3223 |

FOREIGN PATENT DOCUMENTS

| CN | 1575063 A | 2/2005 |
| CN | 101499151 A | 8/2009 |
| CN | 101499516 A | 8/2009 |

(Continued)

OTHER PUBLICATIONS

CN101499516 (Year: 2009).*

(Continued)

*Primary Examiner* — Kyoung Lee
*Assistant Examiner* — Christina A Sylvia
(74) *Attorney, Agent, or Firm* — McDermott Will & Emery LLP

(57) ABSTRACT

An anode includes at least one first electrode, and a reflecting electrode disposed on a side of the at least one first electrode configured to face a light emitting portion of the light emitting device.

15 Claims, 14 Drawing Sheets

(56) References Cited

FOREIGN PATENT DOCUMENTS

| | | |
|---|---|---|
| CN | 109461842 A | 3/2019 |
| JP | 2001-4993 A | 1/2001 |

OTHER PUBLICATIONS

First Office Action issued in corresponding Chinese Application No. 201811314188.1, dated Nov. 19, 2019, with English translation.
Second Office Action issued in corresponding Chinese Application No. 201811314188.1, dated Apr. 22, 2020, with English translation.
Decision of Rejection issued in corresponding Chinese Application No. 201811314188.1, dated Jul. 27, 2020, with English translation.

* cited by examiner

S16: Forming a third reflecting electrode layer on a side of the at least one second light-transmitting electrode layer away from the base substrate, the third reflecting electrode layer including at least one third reflecting electrode, orthographic projection(s) of the at least one third reflecting electrode on the base substrate being at least partially overlapped with orthographic projection(s) of at least one of the plurality of light emitting portions on the base substrate, and the orthographic projection(s) of the at least one third reflecting electrode on the base substrate being not overlapped with the orthographic projections of the at least one first reflecting electrode and the at least one second reflecting electrode on the base substrate S17: Forming at least one third light-transmitting electrode layer on a side of the third reflecting electrode layer away from the base substrate, each third light-transmitting electrode layer including a plurality of third light-transmitting electrodes, orthographic projections of the plurality of third light-transmitting electrodes on the base substrate being at least partially overlapped with the orthographic projections of the plurality of first electrodes on the base substrate, respectively

ANODE, LIGHT EMITTING DEVICE, DISPLAY SUBSTRATE AND METHOD OF MANUFACTURING THE SAME, AND DISPLAY DEVICE

CROSS-REFERENCE TO RELATED APPLICATIONS

This application is a national phase entry under 35 USC 371 of International Patent Application No. PCT/CN2019/115360 filed on Nov. 4, 2019, which claims priority to Chinese Patent Application No. 201811314188.1 filed with the Chinese Patent Office on Nov. 6, 2018, titled "OLED ANODE, OLED SUBSTRATE AND METHOD OF MANUFACTURING THE SAME, AND DISPLAY DEVICE", which are incorporated herein by reference in their entirety.

TECHNICAL FIELD

The present disclosure relates to the field of display technologies, and in particular to an anode of a light emitting device, a light emitting device, a display substrate and a method of manufacturing the same, and a display device.

BACKGROUND

Due to its advantages of high brightness, full angle of view, fast response, flexible display or the like, an organic light emitting diode (OLED) has been widely applied in the display field.

SUMMARY

In one aspect, an anode of a light emitting device is provided. The anode includes at least one first electrode, and a reflecting electrode disposed on a side of the at least one first electrode configured to face a light emitting portion of the light emitting device.

In some embodiments, the anode further includes at least one second electrode disposed on a side of the reflecting electrode away from the at least one first electrode. The at least one second electrode is configured to be light-transmittable.

In some embodiments, a material of the at least one second electrode includes transparent conductive metal oxide.

In some embodiments, a material of the at least one electrode includes at least one of metal or conductive metal oxide.

In some embodiments, a material of the reflecting electrode includes at least one of silver, aluminum or molybdenum.

In some embodiments, the at least one first electrode includes a plurality of first electrodes disposed in a stack. Or the at least one second electrode includes a plurality of second electrodes disposed in a stack. Or the at least one first electrode includes a plurality of first electrodes disposed in a stack, and the at least one second electrode includes a plurality of second electrodes disposed in a stack.

In another aspect, a light emitting device is provided. The light emitting device includes the anode according to any one of the above embodiments, a cathode and a light emitting portion disposed between the anode and the cathode. The reflecting electrode in the anode is configured to reflect light emitted by the light emitting portion, and the cathode is configured to be light-transmittable.

In yet another aspect, a display substrate is provided. The display substrate includes a base substrate, and a plurality of sub-pixels disposed on the base substrate. Each sub-pixel includes the light emitting device according to any one of the above embodiments, and the anode of the light emitting device is closer to the base substrate than the cathode of the light emitting device.

In some embodiments, an orthographic projection of the reflecting electrode on a reference plane is at least partially overlapped with an orthographic projection of the light emitting portion on the reference plane. The reference plane is parallel to a surface of the at least one first electrode configured to face the light emitting portion.

In some embodiments, the plurality of sub-pixels include at least two types of sub-pixels, and each type of sub-pixels is configured to display a color. A distance between the reflecting electrode and the light emitting portion in each sub-pixel for displaying one color is different from a distance between the reflecting electrode and the light emitting portion in each sub-pixel for displaying another color.

In some embodiments, the at least two type of sub-pixels include a red sub-pixel, a green sub-pixel, and a blue sub-pixel. A distance between the reflecting electrode and the light emitting portion in the blue sub-pixel is less than a distance between the reflecting electrode and the light emitting portion in the green sub-pixel. A distance between the reflecting electrode and the light emitting portion in the green sub-pixel is less than a distance between the reflecting electrode and the light emitting portion in the red sub-pixel.

In some embodiments, along a direction that is perpendicular to the base substrate and points to the cathode from the anode of the light emitting device, in the light emitting device included in the red sub-pixel, the at least one first electrode includes a blue first electrode $A_{B1}$, a blue first electrode $A_{B2}$ and a blue first electrode $A_{B3}$, the reflecting electrode includes a blue reflecting electrode, and the light emitting device further includes a blue second electrode $B_{B1}$; and the blue first electrodes $A_{B1}$, $A_{B2}$ and $A_{B3}$, the blue reflecting electrode, and the blue second electrode $B_{B1}$ are disposed on the base substrate in sequence;

in the light emitting device included in the green sub-pixel, the at least one first electrode includes a green first electrode $A_{G1}$ and a green first electrode $A_{G2}$, the reflecting electrode includes a green reflecting electrode, and the light emitting device further includes a green second electrode $B_{G1}$ and a green second electrode $B_{G2}$; and the green first electrodes $A_{G1}$ and $A_{G2}$, the green reflecting electrode, and the green second electrodes $B_{G1}$ and $B_{G2}$ are disposed on the base substrate in sequence; and in the light emitting device included in the red sub-pixel, the at least one first electrode includes a red first electrodes $A_{R1}$, the reflecting electrode includes a red reflecting electrode, and the light emitting device further includes a red second electrode $B_{R1}$, a red second electrode $B_{R2}$ and a red second electrode $B_{R3}$; and the red first electrodes $A_{R1}$, the red reflecting electrode, and the red second electrodes and $B_{R1}$, $B_{R2}$ and $B_{R3}$ are disposed on the base substrate in sequence.

The red first electrode $A_{R1}$, the green first electrode $A_{G1}$ and the blue first electrode $A_{B1}$ are disposed in a same layer; the blue first electrode $A_{B2}$, the green first electrode $A_{G2}$ and the red second electrode $B_{R1}$ are disposed in a same layer; the blue first electrode $A_{B3}$, the green second electrode $B_{G1}$ and the red second electrode $B_{R2}$ are disposed in a same layer; and the blue second electrode $B_{B1}$, the green second electrode $B_{G2}$ and the red second electrode $B_{R3}$ are disposed in a same layer.

The blue first electrode $A_{B2}$, the blue first electrode $A_{B3}$, the blue second electrode $B_{B1}$, the green first electrode $A_{G2}$, the green second electrode $B_{G1}$, the green second electrode $B_{G2}$, the red second electrode $B_{R1}$, the red second electrode $B_{R2}$ and the red second electrode $B_{R3}$ are all configured to be light-transmittable.

In some embodiments, the plurality of sub-pixels include at least two types of sub-pixels, and each type of sub-pixels is configured to display a color;

light emitted by the light emitting portion in each sub-pixel for displaying one color and light emitted by the light emitting portion in each sub-pixel for displaying another color are different in color; or, light emitting portions in the sub-pixels for displaying different colors are all white light emitting portions, each sub-pixel further includes a color filter portion disposed above a side of the light emitting device away from the base substrate, and the color filter portion in each sub-pixel for displaying one color and the color filter portion in each sub-pixel for displaying another color are different in color.

In yet another aspect, a method of manufacturing a display substrate is provided. The method includes providing a base substrate, forming a plurality of anodes on a side of the base substrate, and forming a plurality of light emitting portions on sides of the plurality of anodes away from the base substrate, respectively. Forming the plurality of anodes on the side of the base substrate, includes: forming at least one electrode layer on a side of the base substrate, each electrode layer including a plurality of first electrodes; and, forming a first reflecting electrode layer on a side of the at least one electrode layer away from the base substrate, the first reflecting electrode layer including at least one first reflecting electrode, an orthographic projection of the one first reflecting electrode on the base substrate being at least partially overlapped with an orthographic projection of a corresponding one of the plurality of light emitting portions on the base substrate.

In some embodiments, forming the plurality of anodes on the side of the base substrate, further includes: forming at least one first light-transmitting electrode layer on the base substrate with the at least one electrode layer and the first reflecting electrode layer formed thereon, each first light-transmitting electrode layer including a plurality of first light-transmitting electrodes, an orthographic projection of each of the plurality of first light-transmitting electrodes on the base substrate being at least partially overlapped with an orthographic projection of a corresponding one of the plurality of first electrodes on the base substrate.

In some embodiments, forming the plurality of anodes on the side of the base substrate, further includes: forming a second reflecting electrode layer on a side of the at least one first light-transmitting electrode layer away from the base substrate, the second reflecting electrode layer including at least one second reflecting electrode, an orthographic projection of one second reflecting electrode on the base substrate being at least partially overlapped with an orthographic projection of a corresponding one of the plurality of light emitting portions on the base substrate, and an orthographic projection of each second reflecting electrode on the base substrate being not overlapped with an orthographic projection of any one first reflecting electrode on the base substrate; and, forming at least one second light-transmitting electrode layer on a side of the second reflecting electrode layer away from the base substrate, each second light-transmitting electrode layer including a plurality of second light-transmitting electrodes, an orthographic projection of each of the plurality of second light-transmitting electrodes on the base substrate being at least partially overlapped with an orthographic projection of a corresponding one of the plurality of first electrodes on the base substrate.

In some embodiments, forming the plurality of anodes on the side of the base substrate, further includes: forming a third reflecting electrode layer on a side of the at least one second light-transmitting electrode layer away from the base substrate, the third reflecting electrode layer including at least one third reflecting electrode, an orthographic projection of one third reflecting electrode on the base substrate being at least partially overlapped with an orthographic projection of a corresponding one of the plurality of light emitting portions on the base substrate, and an orthographic projection of each third reflecting electrode on the base substrate being not overlapped with the orthographic projections of any one first reflecting electrode and any one second reflecting electrode on the base substrate; and, forming at least one third light-transmitting electrode layer on a side of the third reflecting electrode layer away from the base substrate, each third light-transmitting electrode layer including a plurality of third light-transmitting electrodes, an orthographic projection of each of the plurality of third light-transmitting electrodes on the base substrate being at least partially overlapped with an orthographic projection of a corresponding one of the plurality of first electrodes on the base substrate.

In some embodiments, the base substrate includes at least one red sub-pixel region, at least one green sub-pixel region and at least one blue sub-pixel region, each red sub-pixel region being configured to be provided with a red sub-pixel, each green sub-pixel region being configured to be provided with a green sub-pixel, each blue sub-pixel region being configured to be provided with a blue sub-pixel. The at least one first reflecting electrode is disposed in the at least one red sub-pixel region, respectively; the at least one second reflecting electrode is disposed in the at least one green sub-pixel region, respectively; and, the at least one third reflecting electrode is disposed in the at least one blue sub-pixel region, respectively.

In some embodiments, the at least one electrode layer, the at least one first light-transmitting electrode layer, the at least one second light-transmitting electrode layer and the at least one third light-transmitting electrode layer are formed by sputtering.

In some embodiments, the first reflecting electrode layer, the second reflecting electrode layer and the third reflecting electrode layer are formed by printing or sputtering.

In yet another aspect, a display device is provided. The display device includes the display substrate according to any one of the above embodiments.

BRIEF DESCRIPTION OF THE DRAWINGS

In order to describe technical solutions in embodiments of the present disclosure more clearly, the accompanying drawings to be used in the description of the embodiments will be introduced briefly. Obviously, the accompanying drawings to be described below are merely some embodiments of the present disclosure, and other accompanying drawings may be obtained according to these accompanying drawings by a person of ordinary skill in the art.

FIGS. 3A-1 to 3A-6 are schematic diagrams showing structures of steps of manufacturing the display substrate of FIG. 3A;

FIG. 4 is a flow diagram showing a method of manufacturing a display substrate, according to some embodiments of the present disclosure;

FIG. 5 is a flow diagram showing another method of manufacturing a display substrate, according to some embodiments of the present disclosure;

FIG. 6 is a schematic diagram showing formation of each electrode layer, according to some embodiments of the present disclosure;

FIG. 9 is a flow diagram showing yet another method of manufacturing a display substrate, according to some embodiments of the present disclosure.

DETAILED DESCRIPTION

Some embodiments of the present disclosure will be described below with reference to the accompanying drawings. Obviously, the embodiments to be described are merely some but not all the embodiments of the disclosure. All other embodiments obtained by a person of ordinary skill in the art on the basis of the embodiments provided in the present disclosure are within the protection scope of the present disclosure.

A common OLED is of a "sandwich" structure. That is, the OLED includes an anode and a cathode opposite to each other, and a light emitting layer sandwiched between the anode and the cathode. In an OLED display device, OLEDs are generally disposed on a base substrate in an array form. In each OLED, the anode is generally disposed on a side of the light emitting layer proximate to the base substrate, i.e., on the bottom of the OLED; and, the cathode is generally disposed on a side of the light emitting layer away from the base substrate, i.e., on the top of the OLED. Thus, OLED display devices may be classified into three types, i.e., top-emitting OLED display devices, bottom-emitting OLED display devices and double-sided emitting OLED display devices, according to the light exit direction of the light emitting layer of each OLED. In a case where the OLED display device is a top-emitting OLED display device, the cathode is a transparent electrode, so that light emitted by the light emitting layer may be transmitted from the cathode to realize a top-emitting effect.

However, most of the top-emitting OLED display devices are of a structure formed by white organic light emitting diodes (WOLEDs) and color films (CFs) (i.e., a WOLED+CF structure). That is to say, each OLED in the OLED display device emits white light, and a color display of the OLED display device is mainly achieved by using a corresponding color film formed in each sub-pixel. Since the same white light has different light emitting effects after being filtered by color films with different colors, in the OLED display device with the WOLED+CF structure, it is very difficult to improve the light emitting efficiencies of sub-pixels with different colors in the OLED display device effectively and simultaneously, and it is easy to make the color purities of the sub-pixels with different colors in the OLED display device low. As a result, an overall color display effect of the OLED display device may be affected.

Figure 1:
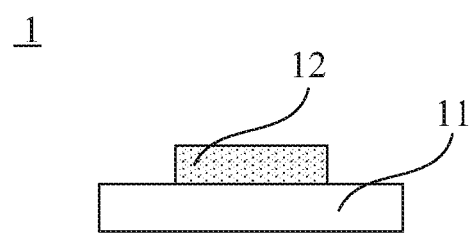
FIG. 1 is a schematic diagram showing a structure of an anode of a light emitting device, according to some embodiments of the present disclosure.
Figure 2:
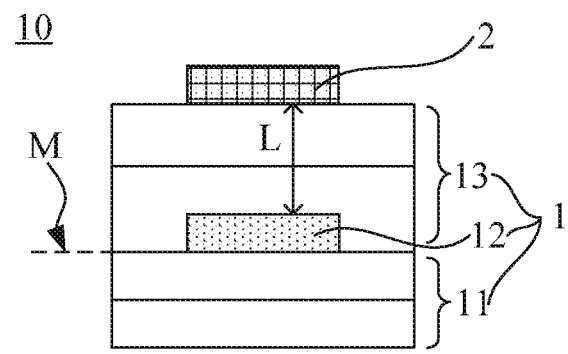
FIG. 2 is a schematic diagram showing a structure of a light emitting device, according to some embodiments of the present disclosure.

On this basis, some embodiments of the present disclosure provide an anode of a light emitting device, which may be applied to a top-emitting display substrate. With reference to FIGS. 1 and 2, the anode 1 includes at least one first electrode 11 and a reflecting electrode 12. In a case where the at least one first electrode 11 include a plurality of first electrodes 11, the first electrodes 11 are disposed in a stack, and the reflecting electrode 12 is disposed on a side of the at least one first electrode 11 configured to face a light emitting portion 2 of the light emitting device 10. In these embodiments, a light emitting effect of the light emitting device 10 may be optimized by the anode 1 of the light emitting device 10. For example, in the light emitting device 10, the light emitting portion 2 is disposed on a side of the reflecting electrode 12 away from the at least first electrode 11. Light emitted to the reflecting electrode 12 from the light emitting portion 2 is reflected by the reflecting electrode 12, and the light may be transmitted to a side of the light emitting portion 2 away from the reflecting electrode 12. In this way, the intensity of light emitted by the light emitting portion 2 to its side away from the reflecting electrode 12 may be enhanced, and the light emitting efficiency of the light emitting device 10 may be improved.

For example, a material of the reflecting electrode 12 includes, but not limited to, at least one of silver, aluminum or molybdenum. For example, the reflecting electrode 12 is an electrode having excellent light reflection characteristics, such as a silver electrode, an aluminum electrode or a molybdenum electrode, so that the reflecting electrode 12 may have high light reflection efficiency. In this way, the light emitting efficiency of the light emitting device may be effectively improved, and the light emitting brightness may be improved. It will be noted that, the reflectivity of the reflecting electrode 12 in the anode 1 may be set according to the light emitting requirements of the light emitting device to which the anode 1 is applied. For example, in a case where the light emitting device is relatively low in light emitting efficiency, it is possible to provide a reflecting electrode 12 with high reflectivity to effectively improve the light emitting efficiency of the light emitting device; and in a case where the light emitting device is relatively high in light emitting efficiency, it is possible to provide a reflecting electrode 12 with low reflectivity to reduce the effect of improving the light emitting efficiency of the light emitting device. In this way, in a case where a plurality of light emitting devices are provided, the light emitting efficiencies of the light emitting devices may be balanced, so that it is advantageous for the uniformity of the light emitting effects (e.g., brightness) of all the light emitting devices.

For example, with reference to FIG. 2, an orthographic projection of the reflecting electrode 12 on a reference plane M is at least partially overlapped with an orthographic projection of the light emitting portion 2 on the reference plane M. Here, the reference plane M is parallel to a surface of the at least one first electrode 11 configured to face the light emitting portion 2 of the light emitting device 10. In this way, most of light emitted by the light emitting portion 2 to the at least one first electrode 11 may be effectively reflected by the reflecting electrode 12. It will be noted that, to enable the reflecting electrode 12 to more effectively reflect the light emitted by the light emitting portion 2 to a side where the at least one first electrode 11 is disposed, in some examples, as shown in FIG. 2, the orthographic projection of the reflecting electrode 12 on the reference plane M is completely overlapped with the orthographic projection of the light emitting portion 2 on the reference plane M.

In some embodiments, with reference to FIG. 2, the anode 1 of a light emitting device further includes at least one second electrode 13 disposed on a side of the reflecting electrode 12 away from the at least one first electrode 11. In a case where the at least one second electrode 13 include a plurality of second electrodes 13, the second electrodes 13 are disposed in a stack. Each of the at least one second electrode 13 is configured to be light-transmittable. In this case, with reference to FIG. 2, in the light emitting device 10, the light emitting portion 2 is disposed on a side of the at least one second electrode 13 away from the reflecting electrode 12. Since each second electrode 13 is configured to be light-transmittable, in these embodiments, the intensity of light emitted by the light emitting portion 2 to its side away from the reflecting electrode 12 may still be enhanced by the reflecting electrode 12, and a distance between the reflecting electrode 12 and the light emitting portion 2 may be adjusted by using the at least one second electrode 13. For example, in a case where each second electrode 13 is the same in thickness, the distance between the reflecting electrode 12 and the light emitting portion 12 may be adjusted by changing the number of second electrodes 13 in each anode 1. For another example, in a case where the number of second electrodes 13 in each anode 1 remains unchanged, the distance between the reflecting electrode 12 and the light emitting portion 2 may be adjusted by adjusting the thickness of one or more second electrodes 13.

It will be noted that, the distance between the reflecting electrode 12 and the light emitting portion 2 (i.e., a reflection cavity length L of the light emitting portion 2) needs to be adjusted according to the design requirements of the light emitting device as long as the gain peak of the light emitting device may be adjusted to enhance the light emission of the light emitting device. For example, the gain setting of the light emitted by the light emitting portion 2 (i.e., the emergent light) needs to satisfy the following formula:

$$\varphi_1 + \varphi_2 + 2\frac{2\pi}{\lambda}nL\cos\theta = 2m\pi;$$

where $\varphi_1$ and $\varphi_2$ are interface reflection phase shifts of the anode and cathode in a corresponding light emitting device, respectively; $\lambda$ is the wavelength of the emergent light from the light emitting portion; n is the refractive index of the film layer through which the emergent light from the light emitting portion passes (in a case where the emergent light passes through a plurality of film layers, the refractive index is an equivalent value of refractive indices of the plurality of film layers); $\theta$ is the included angle between the light exit direction of the light emitting portion and the normal of the light exit surface; L is the reflection cavity length of the light emitting portion; and m is an integer.

It will be also noted that, in a case where the emergent light from the light emitting portion is white light and the emergent light is to be filtered by a color filter portion (e.g., red light, green light or blue light is transmitted after filtering), $\lambda$ is the wavelength of light of any color. For example, if the red light is to be strengthened, the value of $\lambda$ may be within a range of 600 nm to 720 nm, inclusive; if the green light is to be strengthened, the value of $\lambda$ may be within a range of 510 nm to 530 nm, inclusive; and, if the blue light is to be strengthened, the value of $\lambda$ may be within a range of 430 nm to 480 nm, inclusive.

A material of the at least one first electrode 11 includes, but not limited to, at least one of metal or conductive metal oxide as long as the formed first electrode may satisfy the requirements for electrical conductivity. A material of the at least one second electrode 13 includes, but not limited to, transparent conductive metal oxide as long as the formed second electrode may satisfy the requirements for electrical conductivity and light transmittance. For example, both the first electrode 11 and the second electrode 13 are ITO electrode layers made of indium tin oxide (ITO). In this way, it is convenient to manufacture, and it is advantageous to simplify the manufacturing process of the anode. Moreover, since the ITO is transparent conductive metal oxide with high light transmittance, the formed second electrode 13 may be high in light transmittance, so that it is advantageous to improve the light emitting efficiency of the light emitting device.

Figure 3A:
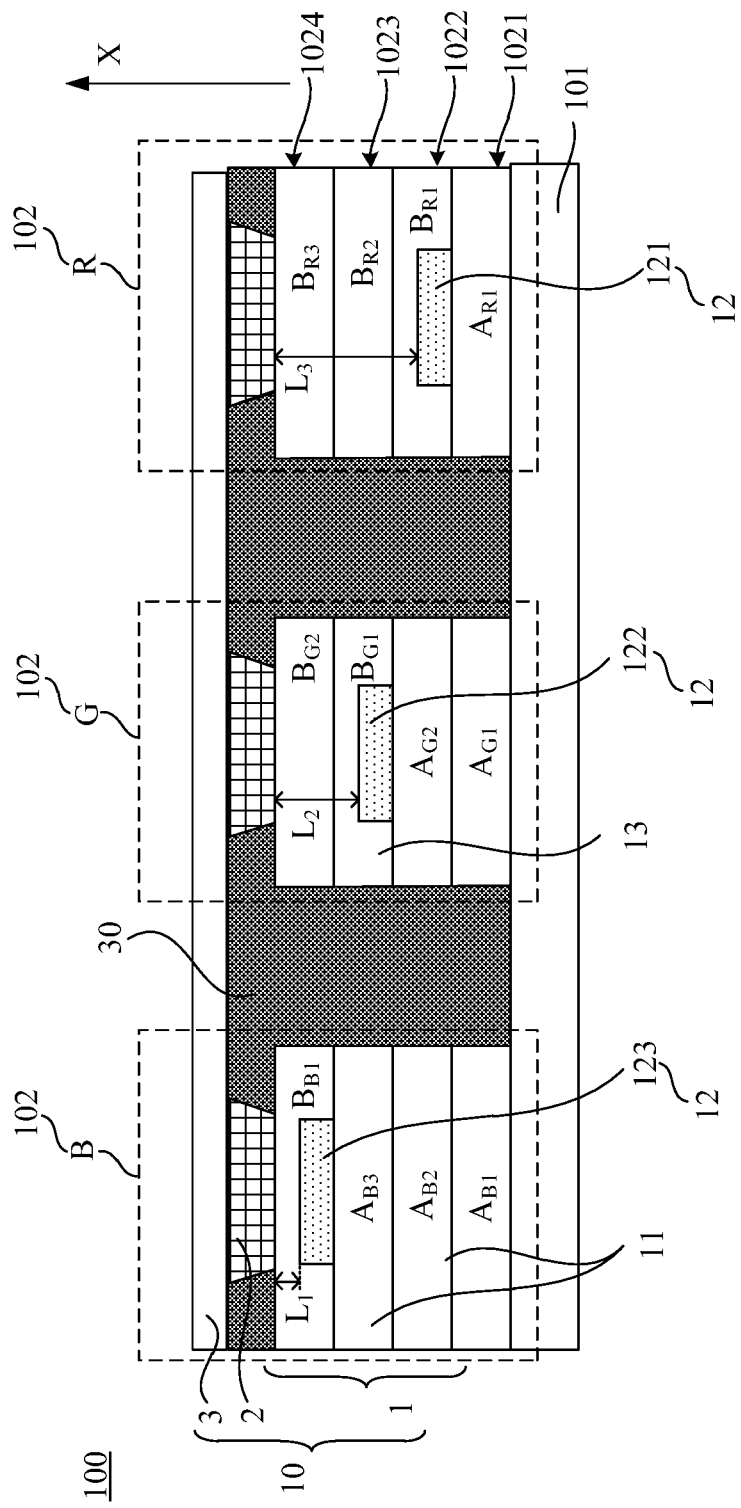
FIG. 3A is a schematic diagram showing a structure of a display substrate, according to some embodiments of the present disclosure.
Figure 3B:
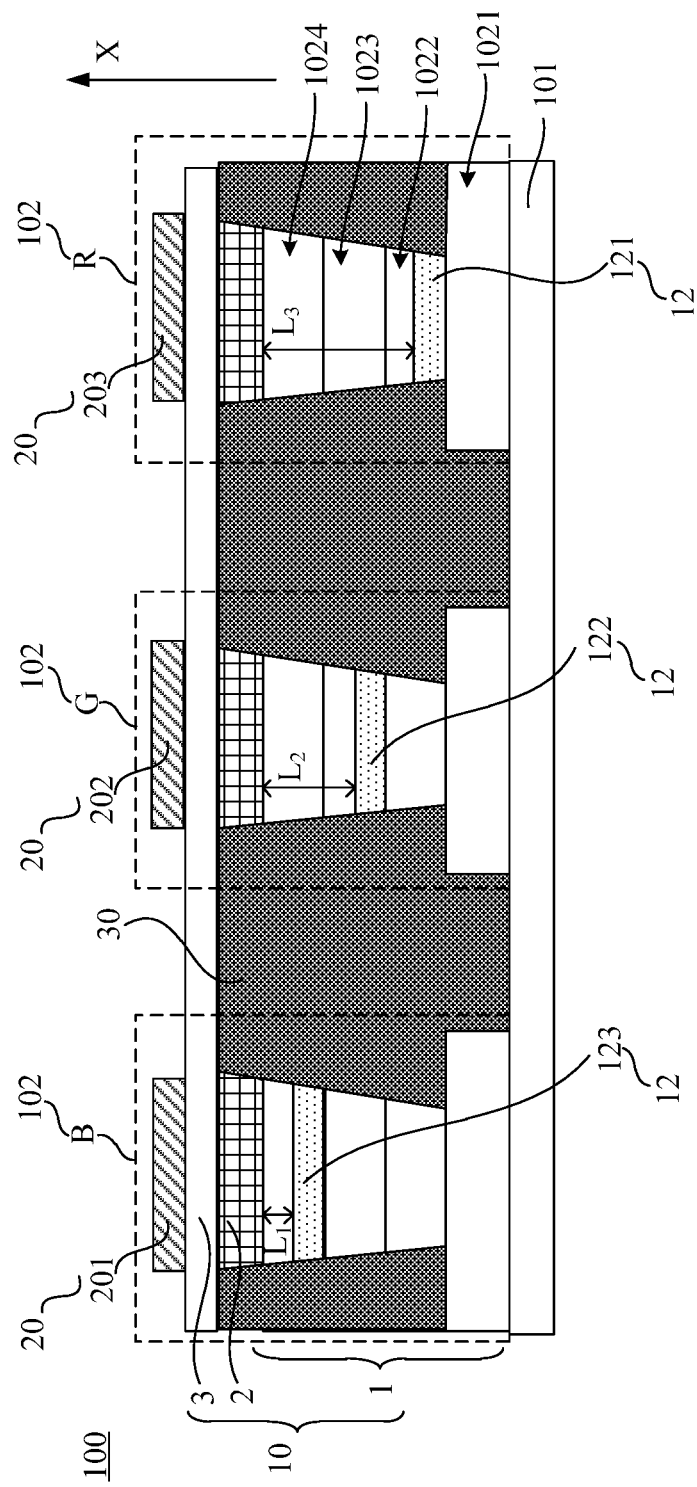
FIG. 3B is a schematic diagram showing a structure of another display substrate, according to some embodiments of the present disclosure.
Figures 1, 3A:
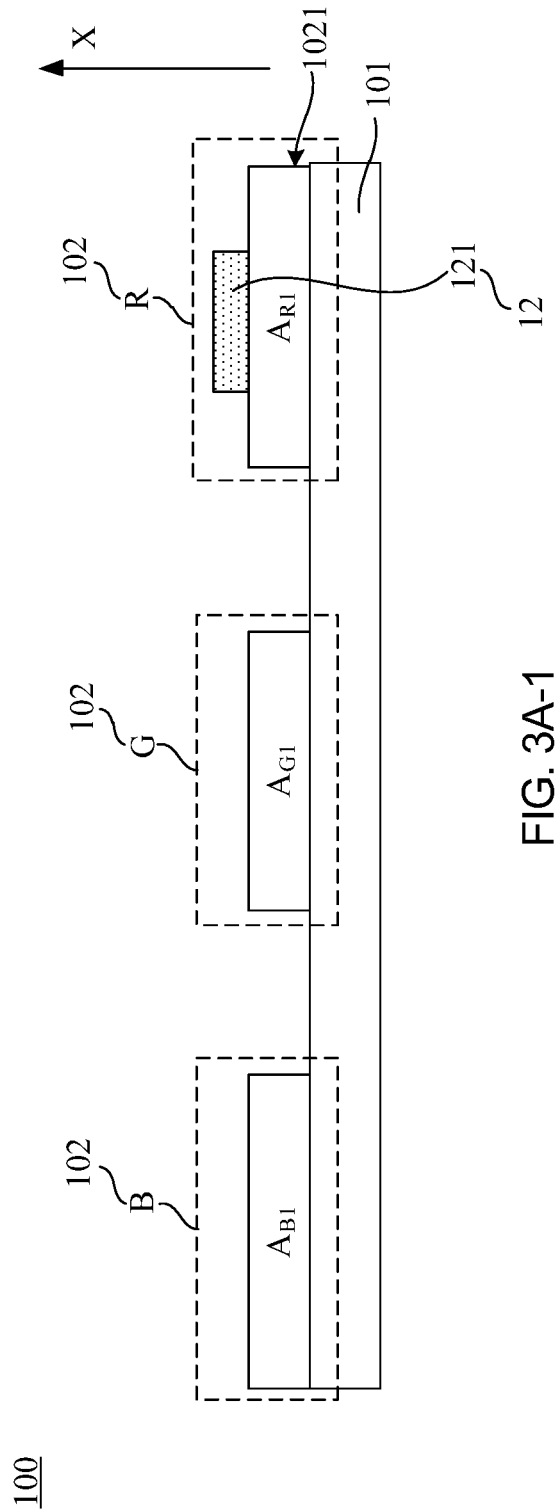
Figures 2, 3A:
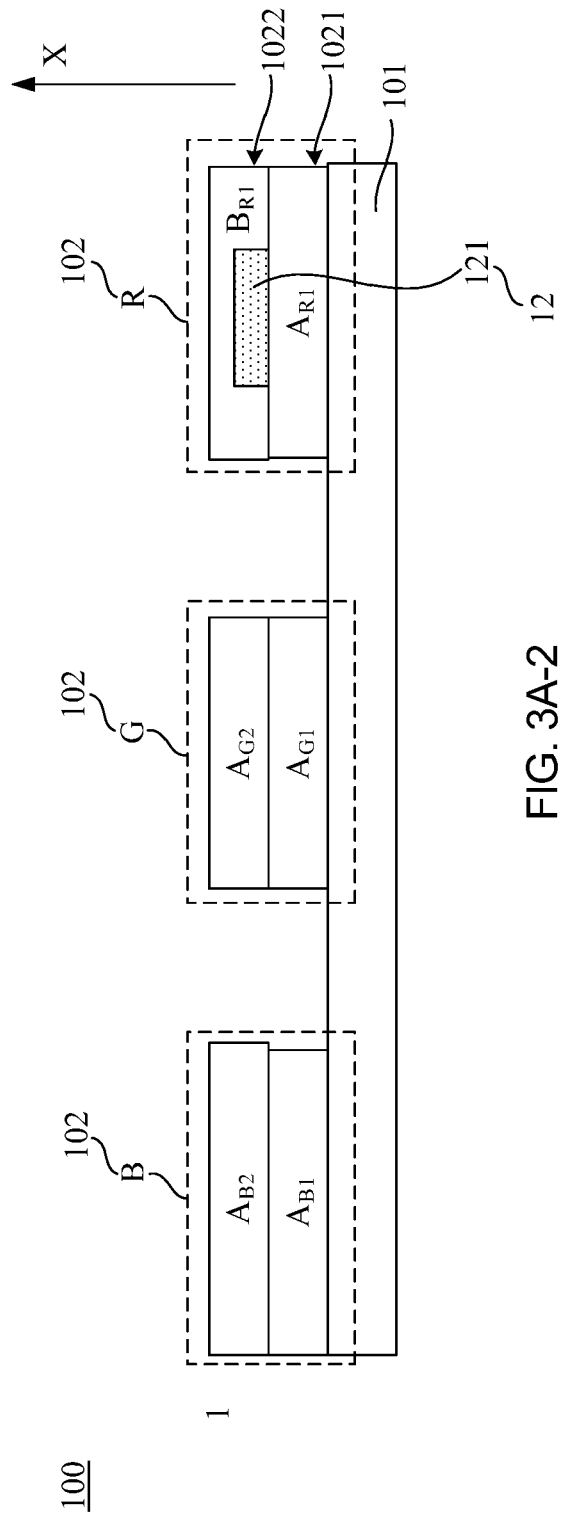
Figures 3, 3A:
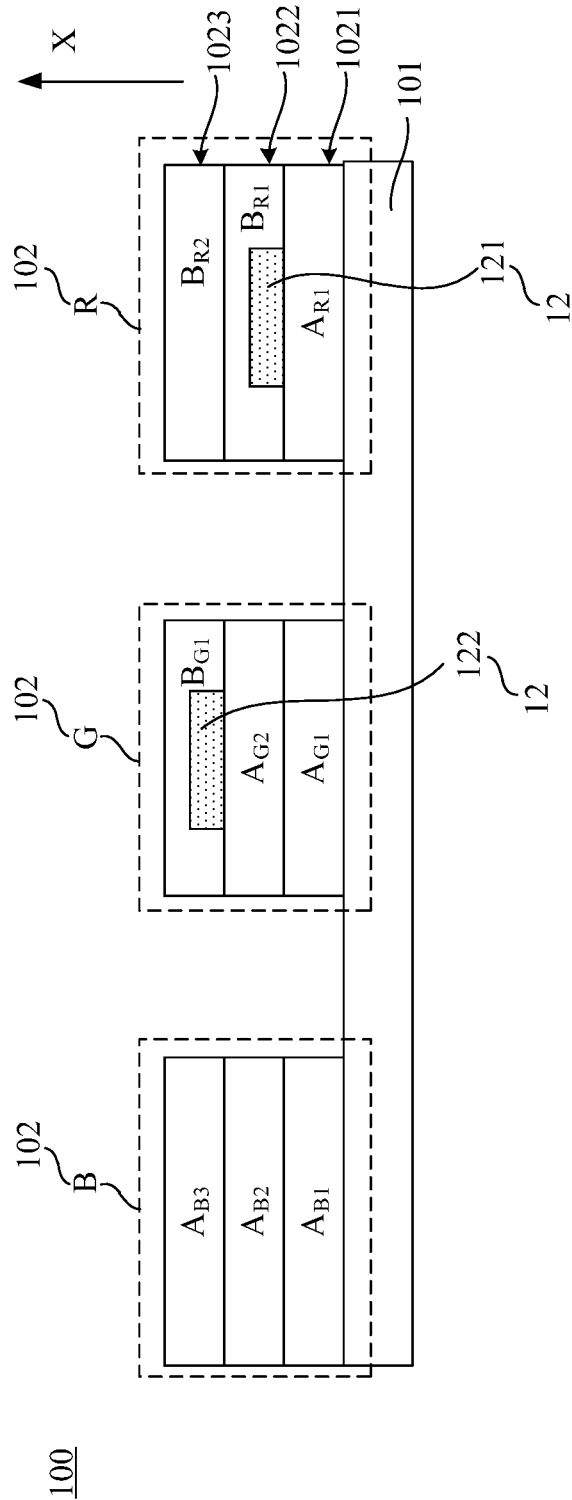

With reference to FIGS. 2, 3A and 3B, some embodiments of the present disclosure provide a light emitting device 10, which may be applied to a top-emitting display substrate 100. The light emitting device 10 includes an anode 1, a cathode 3 and a light emitting portion 2 disposed between the anode 1 and the cathode 3. The anode 1 is the anode of a light emitting device according to any one of the above embodiments, the reflecting electrode 12 in the anode 1 is configured to reflect light emitted by the light emitting portion 2, and the cathode 3 is configured to be light-transmittable. In this way, light emitted to the reflecting electrode 12 from the light emitting portion 2 may be reflected by the reflecting electrode 12, and the light may be transmitted to a side of the light emitting portion 2 away from the reflecting electrode 12 (i.e., a side where the cathode 3 is disposed). Accordingly, the intensity of light transmitted from the light-transmitting cathode 3 may be enhanced, and the light emitting efficiency of the light emitting device 10 may be improved. It will be noted herein that, the reflectivity of the reflecting electrode 12 in the light emitting device and the distance between the reflecting electrode 12 and the light emitting portion 2 may be set according to the light emitting requirements of the light emitting device, and the setting method may refer to one or more embodiments of the anode.

For example, the light emitting device 10 is an OLEO.

With reference to FIGS. 3A and 3B, some embodiments of the present disclosure provide a display substrate 100. The display substrate 100 includes a base substrate 101 and a plurality of sub-pixels 102. The plurality of sub-pixels 102 are disposed on the base substrate 101, each of the sub-pixels 102 includes at least one light emitting device 10 according to any one of the above embodiments, and the anode 1 of the light emitting device 10 is closer to the base substrate 101 than its cathode 3.

For example, in addition to the at least one light emitting device 10, each sub-pixel 102 further includes a pixel driving circuit disposed on the base substrate 101. The pixel driving circuit is capable to drive the light emitting portion 2 of each light emitting device 10 to emit light so as to form a sub-pixel capable of displaying, so that the display substrate 100 may display images.

In some examples, the plurality of sub-pixels 102 include at least two types of sub-pixels, and each sub-pixel is configured to display a color. Light emitted by light emitting portions 2 of light emitting devices 10 included in the sub-pixels for displaying different colors is different in color. For example, in the display substrate 100 shown in FIG. 3A, the plurality of sub-pixels 102 include at least one red sub-pixel R, at least one green sub-pixel G and at least one blue sub-pixel B. The light emitting portion 2 in each red sub-pixel R is capable to emit red light, the light emitting portion 2 in each green sub-pixel G is capable to emit green light, and the light emitting portion 2 in each blue sub-pixel B is capable to emit blue light.

In other examples, with reference to FIG. 3B, the plurality of sub-pixels 102 include at least two types of sub-pixels, and all the light emitting portions 2 of the light emitting devices 10 included in the sub-pixels for displaying different colors are white light emitting portions. Each sub-pixel 102 further includes a color filter portion 20 disposed above a side of the light emitting device 10 away from the base substrate 101 (e.g., the color filter portion 20 may be disposed on a surface of the cathode away from the light emitting portion, or may be disposed on a glass cover plate corresponding to the display substrate 100). Light filtered by the color filter portions 20 included in the sub-pixels for displaying different colors is different in color. For example, in the display substrate 100 shown in FIG. 3B, the plurality of sub-pixels 102 include at least one red sub-pixel R, at least one green sub-pixel G and at least one blue sub-pixel B. The light emitting portions 2 in all the sub-pixels are the white light emitting portions, the color filter portion 20 in each red sub-pixel R is capable to transmit red light only, the color filter portion 20 in each green sub-pixel G is capable to transmit green light only, and the color filter portion 20 in each blue sub-pixel B is capable to transmit blue light only.

It will be noted that, by reasonably setting the reflectivity and position of the reflecting electrode 12 included in each sub-pixel 102 in the display substrate 100, the light emitting effects of the sub-pixels 102 with different colors in the display substrate 100 may be effectively improved simultaneously, and the non-uniformity of the light emitting effects of the sub-pixels 102 with different colors may be ameliorated. For example, in the sub-pixels 102 with different colors in the display substrate 100, the arrangement of the reflecting electrodes 12 includes, but not limited to, the following examples.

In some examples, the reflecting electrodes 12 in the sub-pixels 102 with different colors are disposed in a same layer, and configured to be the same in reflectivity (e.g., being high in reflectivity). In this case, the light emitting effects of the sub-pixels are enhanced to a same extent by the plurality of reflecting electrodes 12, so that the light emitting efficiencies of the sub-pixels 102 with different colors may be effectively improved simultaneously.

In other examples, the reflecting electrodes in the sub-pixels with different colors are disposed in same layer, and configured to be different in reflectivity. In other words, the reflecting electrodes 12 may be determined according to the light reflection strength required by the light emitting portions 2 in the sub-pixels with corresponding colors. That is, for the sub-pixels with different colors, the reflecting electrodes 12 in corresponding anodes may be made of materials having different reflection strengths. In this way, the light emitting effects of the sub-pixels with different colors may be improved simultaneously, and the light emitting efficiencies of the sub-pixels with different colors may be adjusted simultaneously, so that the light emitting effects (e.g., brightness) of the sub-pixels with different colors may be more balanced, without obvious imbalance. For example, with reference to FIG. 3B, in a case where white light having the same intensity passes through a red filter portion 201, a green filter portion 202 and a blue filter portion 203, respectively, the generated red light, green light and blue light are slightly different in brightness, that is, the generated green light, red light and blue light decrease successively in brightness. In this case, for example, the reflectivity of the reflecting electrode in the green sub-pixel is set to be less than that of the reflecting electrode in the red sub-pixel, and the reflectivity of the reflecting electrode in the red sub-pixel is set to be less than that of the reflecting electrode in the blue sub-pixel. In this way, it is advantageous to reduce the slight difference between the generated green light, red light and blue light, and the light emitting effects of the green sub-pixel, the red sub-pixel and the blue sub-pixel become more balanced. It will be noted herein that, in a case where the reflecting electrodes in the sub-pixels with different colors are disposed in different layers, the light emitting effects of the sub-pixels with different colors may be more balanced by reasonably setting the reflectivities of the reflecting electrodes.

It will be noted that, in the examples where the reflecting electrodes 12 in the sub-pixels 102 with different colors are disposed in a same layer, it is possible that the light emitting portion 2 in each sub-pixel 102 is directly formed on the corresponding reflecting electrode 12; or it is also possible that at least one second electrode 13 is further disposed between the light emitting portion 2 and the reflecting electrode 12 in each sub-pixel 102, and the light emitting portion 2 is formed on the corresponding second electrode 13.

In yet other examples, with reference to FIGS. 3A and 3B, the reflecting electrodes 12 in the sub-pixels 102 with different colors are disposed in different layers. In this case, the anode 1 in each sub-pixel 102 further includes at least one second electrode 13, and the reflecting electrode 12 included in the anode 1 in each sub-pixel 102 is made of a same material (i.e., each reflecting electrode 12 is the same in reflectivity). In this way, for the anode in each sub-pixel 102, by reasonably setting the number of first electrodes 11 and the number of second electrodes 13, the specific position of the reflecting electrode 12 may be adjusted, that is, the distance between the light emitting portion 2 and the corresponding reflecting electrode 12 (i.e., the reflection cavity length of the light emitting portion 2) may be adjusted. Accordingly, the light emitting effect of the corresponding sub-pixel 102 may be effectively controlled by using the distance between the light emitting portion 2 and the corresponding reflecting electrode 12. Moreover, in these embodiments, by reasonably setting the number of first electrodes 11 and the number of second electrodes 13, it also is ensured that the light emitting portions 2 in the sub-pixels with different colors may be in a same plane, and an uniform surface light emission of the display substrate may be realized.

For example, with reference to FIGS. 3A and 3B, the plurality of sub-pixels include at least two types of sub-pixels, and each sub-pixel is configured to display a color. In the light emitting devices included in the sub-pixels for displaying different colors, the distances between reflecting electrodes and light emitting portions (i.e., the reflection cavity lengths of the light emitting portions) are different. In this way, different reflection cavity lengths may be provided for the light emitting portions included in the sub-pixels for displaying different colors in the display substrate, and light emitted by the sub-pixels with different colors in the display substrate may be reflected to different extents, so that the light emitting efficiencies and color display effects of the sub-pixels with different colors in the display substrate are all effectively improved.

It will be noted that, the reflection cavity length of the light emitting portion included in each of the sub-pixels for displaying different colors in the display substrate 100 is set in such a way that the gain peak of the light emitting device included in each of the sub-pixels for displaying different colors may be effectively adjusted to enhance the light emission of the light emitting device. For example, the gain setting of the emergent light from the light emitting portion of the light emitting device needs to satisfy the above-mentioned formula:

$$\varphi_1 + \varphi_2 + 2\frac{2\pi}{\lambda}nL\cos\theta = 2m\pi.$$

For example, with reference to FIGS. 3A and 3B, the display substrate 100 displays in an RGB (i.e., red, green and blue) color mode, that is, the plurality of sub-pixels 102 include at least one red sub-pixel R, at least one green sub-pixel G and at least one blue sub-pixel B. During the calculation of the reflection cavity lengths of the light emitting portions 2 in the sub-pixels 102 with different colors, m may be a same integer. In this case, the distance $L_1$ between the reflecting electrode 12 and the light emitting portion 2 in the blue sub-pixel B (i.e., the reflection cavity length of the light emitting portion 2 in the blue sub-pixel B) is less than the distance $L_2$ between the reflecting electrode 12 and the light emitting portion 2 in the green sub-pixel G (i.e., the reflection cavity length of the light emitting portion 2 in the green sub-pixel G); and the distance $L_2$ between the reflecting electrode 12 and the light emitting portion 2 in the green sub-pixel G is less than the distance $L_3$ between the reflecting electrode 12 and the light emitting portion 2 in the red sub-pixel R (i.e., the reflection cavity length of the light emitting portion 2 in the red sub-pixel R). In this way, the light emitting efficiencies of the sub-pixels with different colors may be improved simultaneously and effectively. Additionally, to reduce the thickness of the anodes included in the sub-pixels for displaying different colors, in this example, m may be set to be 1. Thus, the calculated $L_1$, $L_2$ and $L_3$ are minimum cavity lengths required to gain the light emitted by the sub-pixels.

For example, in each red sub-pixel, each green sub-pixel and each blue sub-pixel, the numbers of first electrodes formed on the side of the base substrate 101 are different. In this example, by forming different numbers of first electrodes in the sub-pixels with different colors, the positions of the reflecting electrodes may be set reasonably. By forming different numbers of second electrodes on the reflecting electrodes, it may be ensured that the light emitting portions in the sub-pixels are in a same plane, and the uniform surface light emission of the display substrate is ensured. Thus, in the display substrate in this example, the light emitting efficiencies of the sub-pixels with different colors may be improved simultaneously by the reflecting electrodes, and the light emitting effects of the corresponding sub-pixels may be effectively controlled by using the distances between the reflecting electrodes and the corresponding light emitting portions. In this way, the display color gamut of the display substrate may be adjusted appropriately, thereby effectively improving the color purity of a display device to which the display substrate is applied and improving the color display effect of the display device.

In order to ensure that the distance $L_1$ between the reflecting electrode 12 and the light emitting portion 2 in the blue sub-pixel B is less than the distance $L_2$ between the reflecting electrode 12 and the light emitting portion 2 in the green sub-pixel G, and the distance $L_2$ between the reflecting electrode 12 and the light emitting portion 2 in the green sub-pixel G is less than the distance $L_3$ between the reflecting electrode 12 and the light emitting portion 2 in the red sub-pixel R, in some embodiments, as shown in FIG. 3A, along a direction X that is perpendicular to the base substrate 101 and points to the cathode 3 from the anode 1 of the light emitting device 10, a structure of the light emitting device 10 in each of the sub-pixels with different colors is as follows:

the light emitting device 10 included in the blue sub-pixel B includes a blue first electrode $A_{B1}$, a blue first electrode $A_{B2}$, a blue first electrode $A_{B3}$, a blue reflecting electrode 123 and a blue second electrode $B_{B1}$ that are disposed in a sequence;

the light emitting device 10 included in the green sub-pixel G includes a green first electrode $A_{G1}$, a green first electrode $A_{G2}$, a green reflecting electrode 122, a green second electrode $B_{G1}$ and a green second electrode $B_{G2}$ that are disposed in a sequence; and the light emitting device 10 included in the red sub-pixel R includes a red first electrodes $A_{R1}$, a red reflecting electrode 121, a red second electrode $B_{R1}$, a red second electrode $B_{R2}$ and a red second electrode $B_{R3}$ that are disposed in a sequence.

The red first electrode $A_{R1}$, the green first electrode $A_{G1}$ and the blue first electrode $A_{B1}$ are disposed in a same layer; the blue first electrode $A_{B2}$, the green first electrode $A_{G2}$ and the red second electrode $B_{R1}$ are disposed in a same layer; the blue first electrode $A_{B3}$, the green second electrode $B_{G1}$ and the red second electrode $B_{R2}$ are disposed in a same layer; and the blue second electrode $B_{B1}$, the green second electrode $B_{G2}$ and the red second electrode $B_{R3}$ are disposed in a same layer.

The blue first electrode $A_{B2}$, the blue first electrode $A_{B3}$, the blue second electrode $B_{B1}$, the green first electrode $A_{G2}$, the green second electrode $B_{G1}$, the green second electrode $B_{G2}$, the red second electrode $B_{R1}$, the red second electrode $B_{R2}$ and the red second electrode $B_{R3}$ are all configured to be light-transmittable.

In these embodiments, by reasonably setting the number of first electrodes 11 and the number of second electrodes 13, the specific positions of the reflecting electrodes 12 included in the sub-pixels 102 for displaying different colors are adjusted. In this way, different reflection cavity lengths are provided for the light emitting portions 2 included in the sub-pixels 102 for displaying different colors in the display substrate 100, and the light emitted by the sub-pixels 102 with different colors in the display substrate 100 is simultaneously reflected to different extents. Accordingly, the light emitting efficiencies and color display effects of the sub-pixels 102 with different colors in the display substrate 100 may be effectively improved.

Figures 3, 3A, 4:
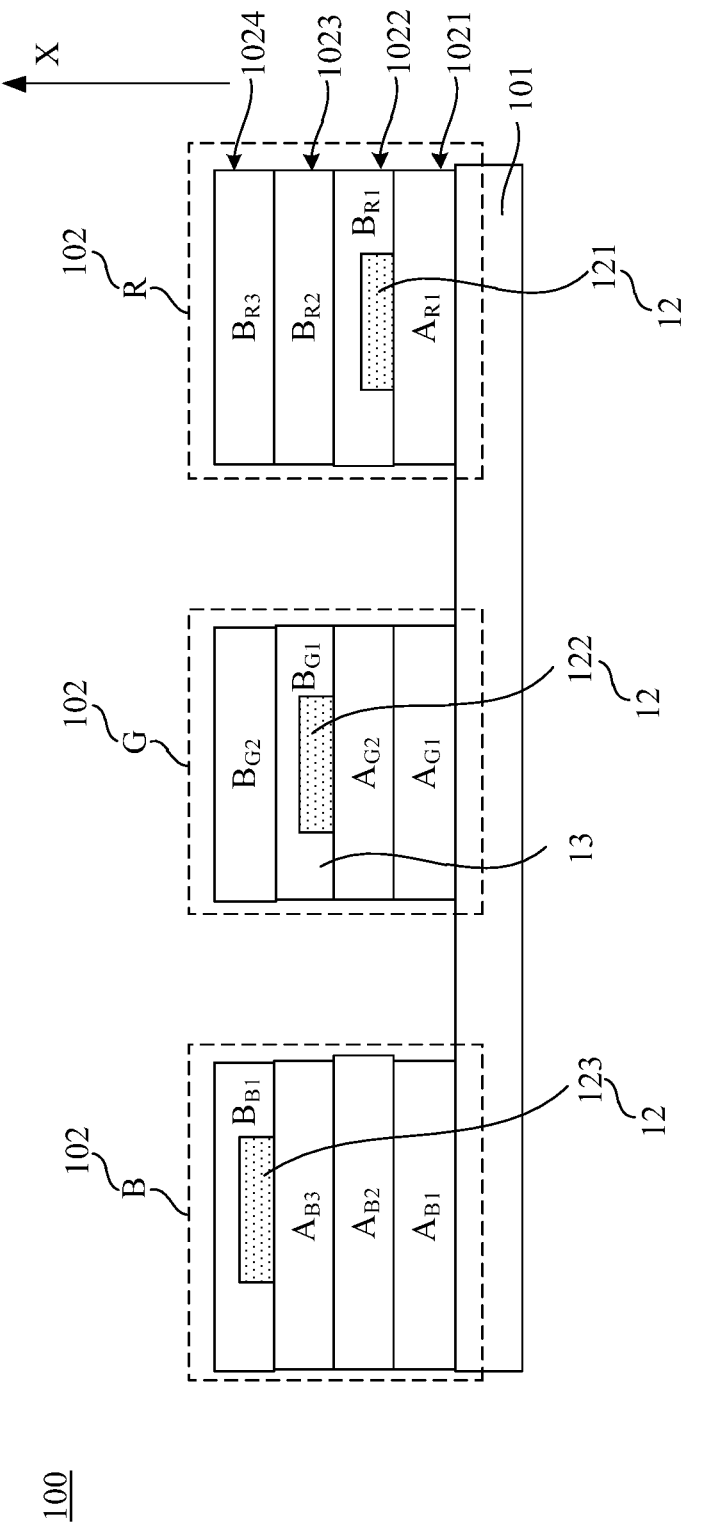
Figures 3, 3A, 4, 5:
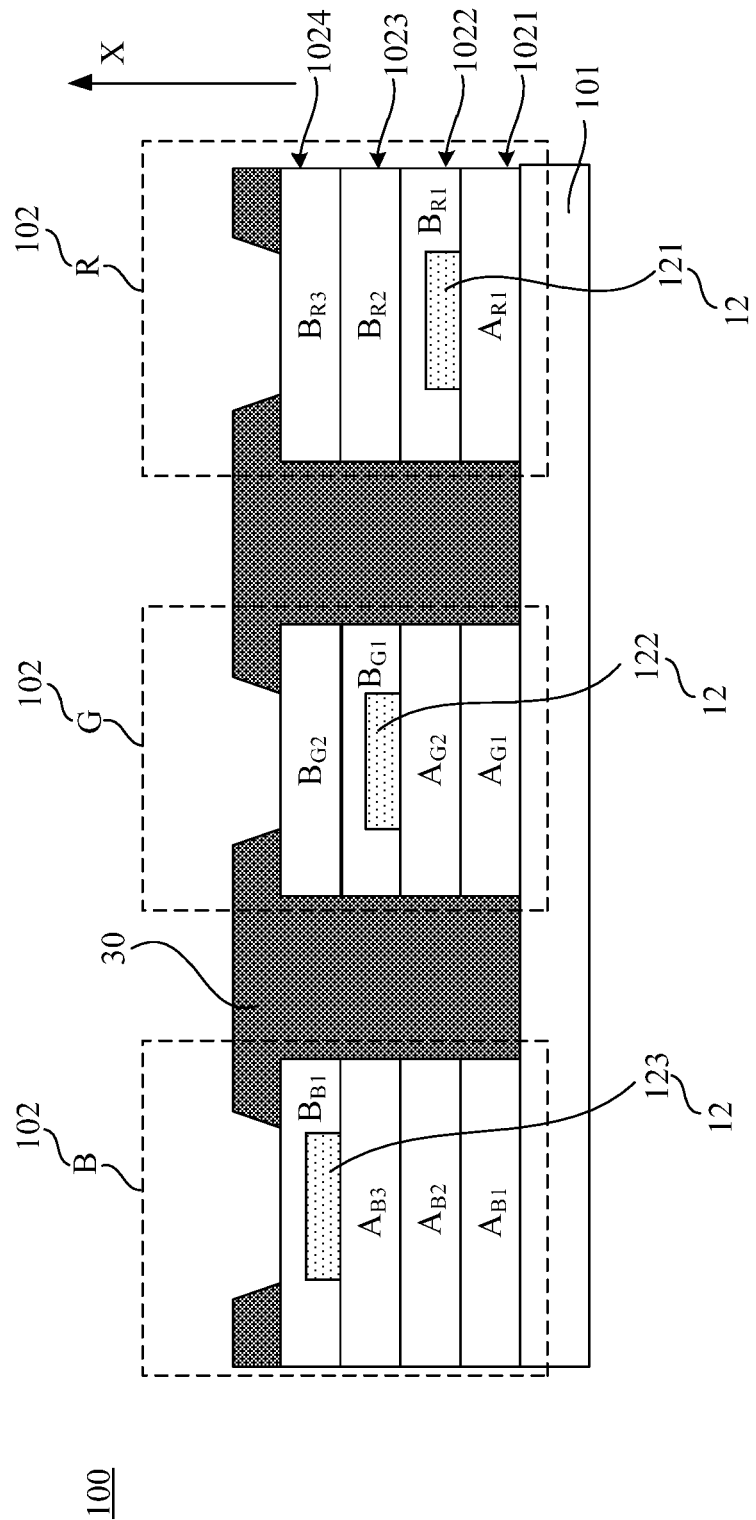

With reference to FIG. 4, some embodiments of the present disclosure provide a method of manufacturing a display substrate, including steps of:

S1: providing a base substrate;

S2: forming a plurality of anodes on a side of the base substrate; and

S3: forming a plurality of light emitting portions on sides of the plurality of anodes away from the base substrate, respectively.

It will be noted that, with reference to FIGS. 3A and 3B, the display substrate formed by S1 to S3 includes a plurality of sub-pixels 102 disposed on the base substrate 101, each sub-pixel 102 includes at least one light emitting device 10, and each light emitting device 10 at least includes an anode 1 and a light emitting portion 2.

For example, the step of forming a plurality of anodes on a side of the base substrate includes steps of S11 and S12.

Figures 3, 3A, 4, 5, 6:
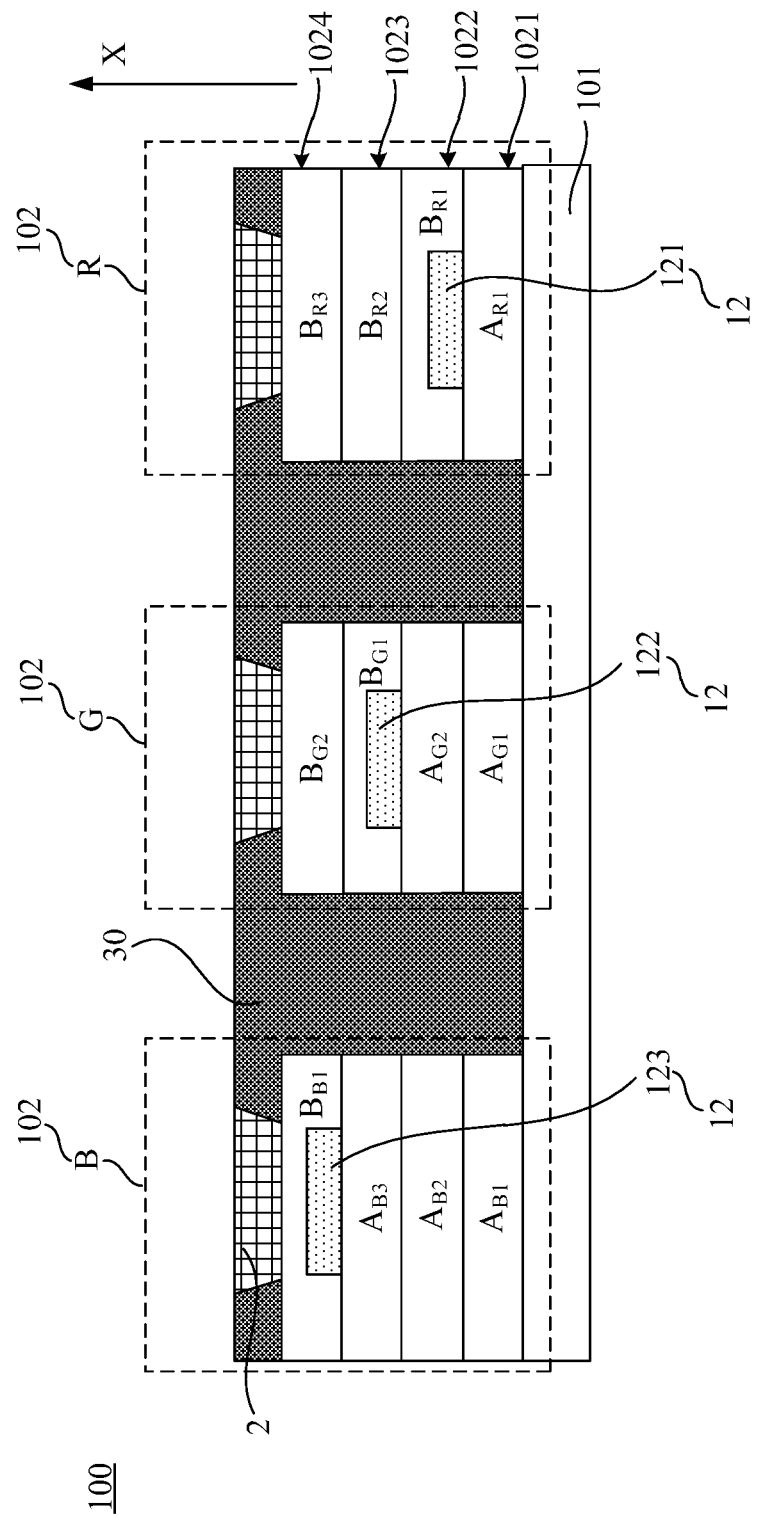
Figure 4:
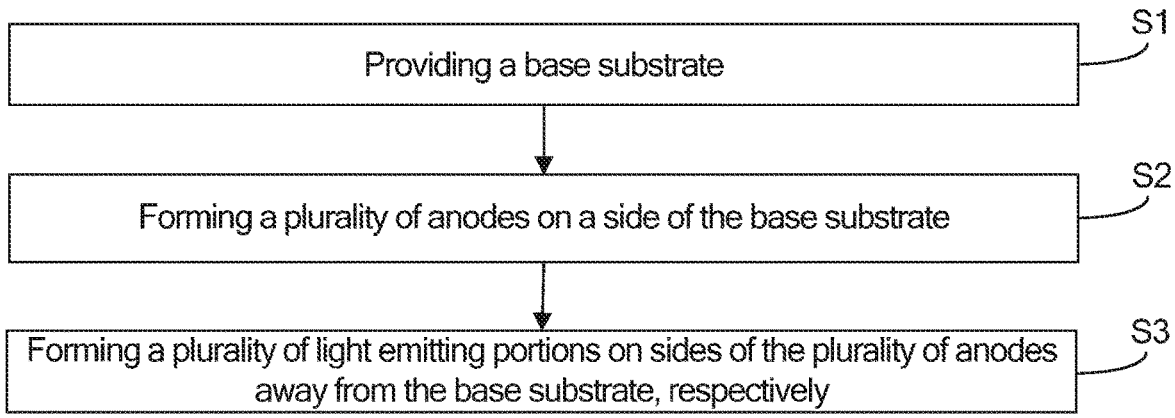
Figure 5:
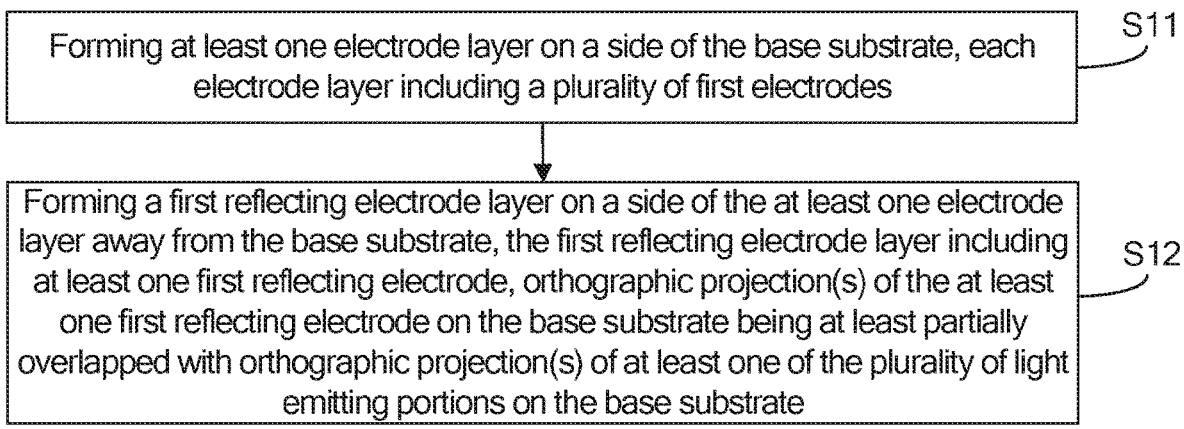
Figure 6:
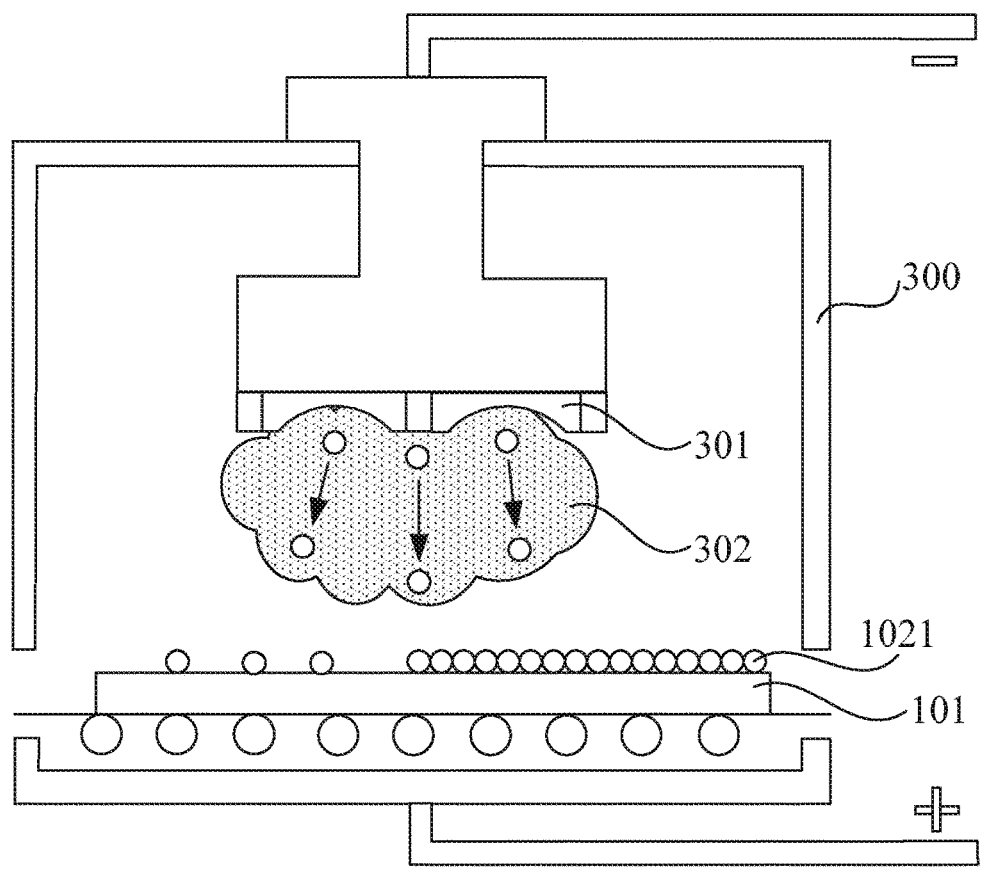

With reference to FIGS. 3A, 3B, 3A-1 and 5, in S11, at least one electrode layer 1021 is formed on a side of the base substrate 101, each electrode layer 1021 includes a plurality of first electrodes. It should be understood that, each first electrode included in each electrode layer 1021 is in one anode 1. For example, each electrode layer 1021 is formed by sputtering. With reference to FIG. 6, after the base substrate 101 is conveyed to a vacuum chamber of a sputtering apparatus 300 by a conveyor belt, a target material 301 may be effectively sputtered onto a surface of the base substrate 101 by controlling the movement of a plasma 302 by an external electrical field, and electrode layers 1021 are gradually sputtered with the movement of the base substrate 101. In this example, by reasonably controlling the sputtering operation of the sputtering apparatus 300 and the conveying speed of the base substrate 101, first electrodes having different thicknesses may be formed in different sub-pixel regions of the base substrate 101 (i.e., regions for forming sub-pixels on the base substrate 101), so that it is convenient to define the positions where the reflecting electrodes are to be formed subsequently.

With reference to FIGS. 3A, 3B, 3A-1 and 5, in S12, a first reflecting electrode layer is formed on a side of the at least one electrode layer 1021 away from the base substrate 101, the first reflecting electrode layer includes at least one first reflecting electrode (e.g., the red reflecting electrode 121), orthographic projection(s) of the at least one first reflecting electrode on the base substrate 101 are at least partially overlapped with orthographic projection(s) of at least one of the plurality of light emitting portions 2 on the base substrate 101. For example, orthographic projections of all the first reflecting electrodes on the base substrate 101 are at least partially overlapped with orthographic projections of all the light emitting portions 2 on the base substrate 101, respectively. In this case, all the first reflecting electrodes are in one-to-one correspondence to all the light emitting portions. For another example, orthographic projections of all the first reflecting electrodes on the base substrate 101 are at least partially overlapped with orthographic projections of some of the plurality of light emitting portions 2 on the base substrate 101, respectively. In this case, all the first reflecting electrodes are in one-to-one correspondence to some of the plurality of light emitting portions 11.

In the case where the orthographic projections of all the first reflecting electrodes on the base substrate 101 are at least partially overlapped with the orthographic projections of all the light emitting portions 2 on the base substrate 101, respectively, for example, the first reflecting electrode layer includes a plurality of first reflecting electrodes. A part of first reflecting electrodes in the plurality of first reflecting electrodes corresponds to sub-pixels for displaying one color, and the other part of first reflecting electrodes in the plurality of first reflecting electrodes corresponds to sub-pixels for displaying another color. The first reflecting electrodes in the two parts may be the same or different in reflectivity. For example, by setting the first reflecting electrodes included in the two parts to be different in reflectivity, it is advantageous for the uniformity of the light emitting efficiencies of the sub-pixels with different colors. It will be noted herein that, the plurality of first reflecting electrodes are not limited to being divided into two parts, and may also be divided into three, four, five or more parts. For example, in a case where the plurality of first reflecting electrodes are divided into three parts, it is possible that a part of first reflecting electrodes corresponds to a plurality of red sub-pixels, another part of first reflecting electrodes corresponds to a plurality of green sub-pixels, and yet another part of first reflecting electrodes corresponds to a plurality of blue sub-pixels. Similarly, the first reflecting electrodes in the three parts may be set to be the same or different in reflectivity.

In the case where the orthographic projections of all the first reflecting electrodes on the base substrate 101 are at least partially overlapped with orthographic projections of some of the plurality of light emitting portions 2 on the base substrate 101, respectively, for example, the first reflecting electrodes are only provided for sub-pixels for displaying one color (e.g., the red sub-pixels, the green sub-pixels or the blue sub-pixels). In this case, all the first reflecting electrodes are the same in reflectivity.

It will be noted that, to enable the first reflecting electrode included in each sub-pixel 102 to effectively reflect the light emitted to a side of the base substrate 101 by the light emitting portion 2 included in this sub-pixel 102, in each sub-pixel 102, the orthographic projection of the first reflecting electrode on the base substrate 101 should be completely overlapped with the orthographic projection of the light emitting portion 2 on the base substrate 101, or the orthographic projection of the light emitting portion 2 on the base substrate 101 should be within a range of the orthographic projection of the first reflecting electrode on the base substrate 101.

Figure 7:
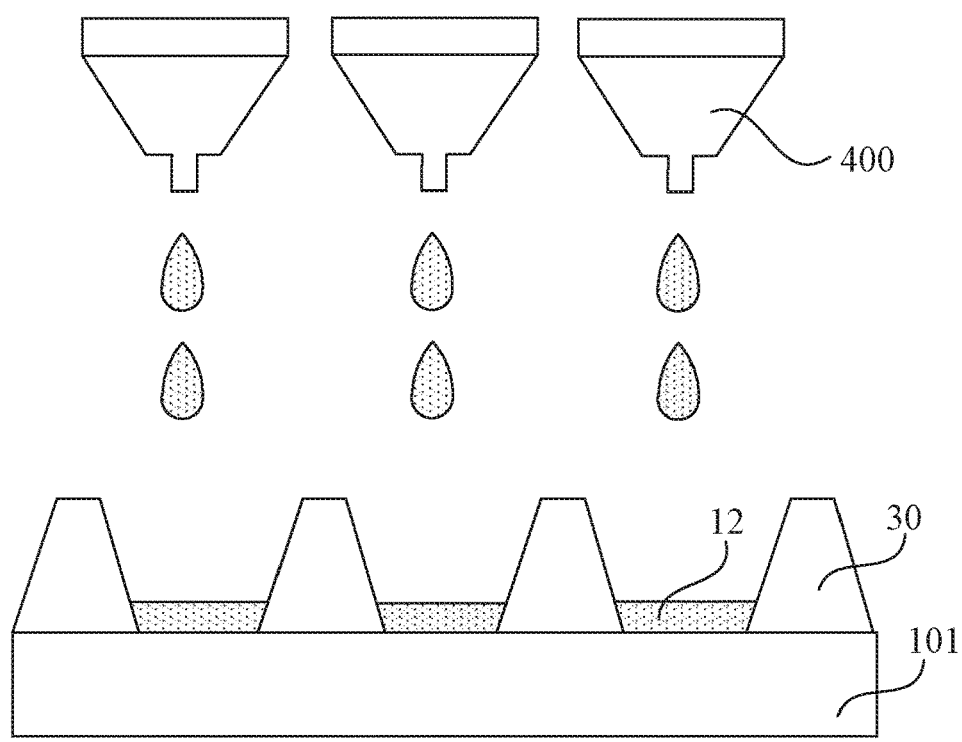
FIG. 7 is a schematic diagram showing formation of reflecting electrodes, according to some embodiments of the present disclosure.
Figure 8:
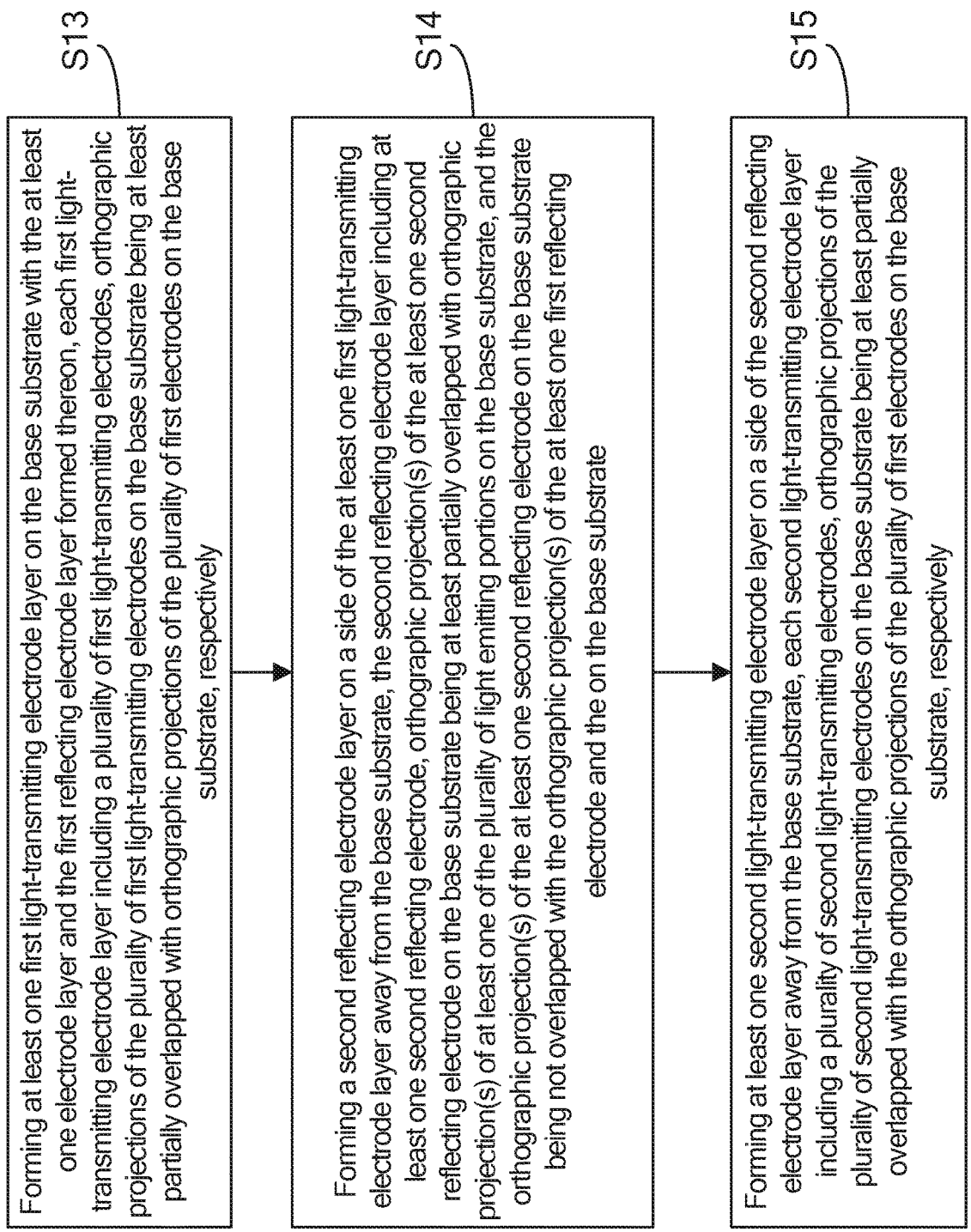
FIG. 8 is a flow diagram showing yet another method of manufacturing a display substrate, according to some embodiments of the present disclosure.

There are many ways to form the first reflecting electrode layer. In some examples, the first reflecting electrode layer is formed by sputtering. In other examples, the first reflecting electrode layer is formed by printing. With reference to FIGS. 3B and 7, according to the division of different sub-pixel regions by a pixel defining layer 30, reflecting electrodes 12 are respectively formed, by corresponding inkjet print heads 400, in the sub-pixel regions on the substrate 101 with the at least one electrode layer 1021 formed thereon. In these examples, by forming the reflecting electrodes 12 by printing, it is ensured that the reflecting electrodes 12 may be pixelated, that is, the reflecting electrodes 12 are accurately formed in the corresponding sub-pixel regions. In this way, it is ensured that the reflecting electrodes 12 included in the sub-pixels with different colors may effectively reflect the light emitted to a side of the base substrate by the light emitting portions, and the light emitting effects of the sub-pixels with different colors in the display substrate may be effectively optimized.

In some embodiments, in addition to S11 and S12, the step of forming a plurality of anodes on a side of the base substrate further includes step 13 (S13).

With reference to FIGS. 3A, 3B, 3A-2 and 8, in S13, at least one first light-transmitting electrode layer 1022 is formed above the base substrate 101 with the at least one electrode layer 1021 and the first reflecting electrode layer formed thereon (that is, the at least one first light-transmitting electrode layer 1022 is formed on surfaces of the plurality of first reflecting electrodes away from the base substrate and on a surface of the at least one electrode layer away from the base substrate and not covered with the plurality of first reflecting electrodes), each first light-transmitting electrode layer 1022 includes a plurality of first light-transmitting electrodes, orthographic projections of the plurality of first light-transmitting electrodes on the base substrate 101 are at least partially overlapped with orthographic projections of the plurality of first electrodes on the base substrate 101, respectively. For example, the orthographic projection of the first light-transmitting electrode included in each sub-pixel on the base substrate 101 is completely overlapped with the orthographic projection of the first electrode included in the same sub-pixel on the base substrate 101.

It will be noted that, the method for forming each first light-transmitting electrode layer 1022 may be the same as the method for forming each electrode layer 1021. In the case where the orthographic projections of all the first reflecting electrodes (e.g., red reflecting electrodes 121) on the base substrate 101 are at least partially overlapped with the orthographic projections of some of the plurality of light emitting portions 2 on the base substrate 101, respectively, each first light-transmitting electrode layer 1022 is formed by a method the same as the method for forming each electrode layer 1021. A surface of the at least one first light-transmitting electrode layer, formed in the sub-pixels not including first reflecting electrodes and the sub-pixels including first reflecting electrodes, away from the base substrate 101 is parallel to the base substrate 101. In this way, it is convenient for the subsequent formation of the plurality of light emitting portions 2, and it is advantageous to ensure that the light emitting portions 2 in the sub-pixels with different colors may be in a same plane, so that the uniform surface light emission of the display substrate may be realized.

Additionally, in the case where the orthographic projections of all the first reflecting electrodes on the base substrate 101 are at least partially overlapped with the orthographic projections of some of the plurality of light emitting portions 2 on the base substrate 101, respectively, for example, in addition to S11, S12 and S13, the step of forming a plurality of anodes on a side of the base substrate further includes steps of S14 and S15.

With reference to FIGS. 3A, 3B, 3A-3 and 8, in S14, a second reflecting electrode layer is formed on a side of the at least one first light-transmitting electrode layer 1022 away from the base substrate 101, the second reflecting electrode layer includes at least one second reflecting electrode (e.g., the green reflecting electrode 122), orthographic projection(s) of the at least one second reflecting electrode on the base substrate 101 are at least partially overlapped with orthographic projection(s) of at least one of the plurality of light emitting portions 2 on the base substrate 101, and the orthographic projection(s) of the at least one second reflecting electrode on the base substrate 101 are not overlapped with the orthographic projection(s) of the at least one first reflecting electrode on the base substrate 101. In this case, the second reflecting electrode and the first reflecting electrode are set to correspond to the sub-pixels with different colors, respectively.

With reference to FIGS. 3A, 3B, 3A-3 and 8, in S15, at least one second light-transmitting electrode layer 1023 is formed on a side of the second reflecting electrode layer away from the base substrate 101 (that is, the at least one second light-transmitting electrode layer 1023 is formed on surfaces of the plurality of second reflecting electrodes away from the base substrate 101 and on a surface of the at least one first light-transmitting electrode layer 1022 away from the base substrate 101 and not covered with the plurality of second reflecting electrodes), each second light-transmitting electrode layer 1023 includes a plurality of second light-transmitting electrodes, orthographic projections of the plurality of second light-transmitting electrodes on the base substrate 101 are at least partially overlapped with the orthographic projections of the plurality of first electrodes on the base substrate 101, respectively. For example, the orthographic projection of the second light-transmitting electrode included in each sub-pixel on the base substrate 101 is completely overlapped with the orthographic projection of the first electrode included in the same sub-pixel on the base substrate 101.

It will be noted that, the method for forming each second light-transmitting electrode layer 1023 may be the same as the method for forming each electrode layer 1021. By forming each second light-transmitting electrode layer 1023 by a method the same as the method for forming each electrode layer 1021, it is convenient for the subsequent formation of the plurality of light emitting portions 2, and it is advantageous to ensure that the light emitting portions 2 in the sub-pixels 102 with different colors may be in a same plane, so that the uniform surface light emission of the display substrate 100 may be realized.

For example, in addition to S11, S12, S13, S14 and S15, the step of forming a plurality of anodes on a side of the base substrate further include steps of S16 and S17.

With reference to FIGS. 3A, 3B, 3A-4 and 9, in S16, a third reflecting electrode layer is formed on a side of the at least one second light-transmitting electrode layer 1023 away from the base substrate 101, the third reflecting electrode layer includes at least one third reflecting electrode (e.g., the blue reflecting electrode 123 in FIGS. 3A, 3B and 3A-4), orthographic projection(s) of the at least one third reflecting electrode on the base substrate 101 are at least partially overlapped with orthographic projection(s) of at least one of the plurality of light emitting portions 2 on the base substrate 101, and the orthographic projection(s) of the at least one third reflecting electrode on the base substrate 101 are not overlapped with the orthographic projections of the at least one first reflecting electrode and the at least one second reflecting electrode on the base substrate 101. In this case, a plurality of third reflecting electrodes, a plurality of second reflecting electrodes and a plurality of first reflecting electrodes are set to correspond to the sub-pixels with different colors, respectively. For example, as shown in FIGS. 3A, 3B and 3A-4, at least one of the plurality of first reflecting electrodes is a red reflecting electrode 121; at least one of the plurality of second reflecting electrodes is a green reflecting electrode 122; and at least one of the plurality of third reflecting electrodes is a blue reflecting electrode 123. Each red reflecting electrode 121 is in a corresponding red sub-pixel R, each green reflecting electrode 122 is in a corresponding green sub-pixel G, and each blue reflecting electrode 123 is in a corresponding blue sub-pixel B.

With reference to FIGS. 3A, 3B, 3A-4 and 9, in S17, at least one third light-transmitting electrode layer 1024 is formed on a side of the third reflecting electrode layer away from the base substrate 101 (that is, the at least one third light-transmitting electrode layer 1024 is formed on surfaces of the plurality of third reflecting electrodes away from the base substrate 101 and on a surface of the at least one second light-transmitting electrode layer 1023 away from the base substrate 101 and not covered with the plurality of third reflecting electrodes), each third light-transmitting electrode layer 1024 includes a plurality of third light-transmitting electrodes, orthographic projections of the plurality of third light-transmitting electrodes on the base substrate 101 are at least partially overlapped with the orthographic projections of the plurality of first electrodes on the base substrate 101, respectively. For example, the orthographic projection of the third light-transmitting electrode included in each sub-pixel on the base substrate 101 is completely overlapped with the orthographic projection of the first electrode included in the same sub-pixel on the base substrate 101.

For example, with reference to FIGS. 3A-5 and 3A-6, after the formation of the at least one third light-transmitting electrode layer 1024, a pixel defining layer 30 having a plurality of opening regions is formed, and then a plurality light emitting portions 2 are formed in the opening regions of the pixel defining layer 30, respectively.

It will be noted that, the method for forming each third light-transmitting electrode layer 1024 may be the same as the method for forming each electrode layer 1021. By forming each third light-transmitting electrode layer 1024 by a method the same as the method for forming each electrode layer 1021, it is convenient for the subsequent formation of the plurality of light emitting portions 2, and it is advantageous to ensure that the light emitting portions 2 in the sub-pixels 102 with different colors may be in a same plane, so that the uniform surface light emission of the display substrate 100 may be realized.

In the display substrate manufactured by the method of manufacturing a display substrate provided in the above embodiments, the reflecting electrodes in the sub-pixels with different colors may be disposed in a same layer, for example, in the above situation where only the plurality of first reflecting electrodes are provided and the plurality of first reflecting electrodes are divided into at least two parts which correspond to sub-pixels with at least two different colors, respectively.

Additionally, the reflecting electrodes in the sub-pixels with different colors may be disposed in different layers, for example, in the above situation where the at least one first reflecting electrode and the at least second reflecting electrode are provided, and in the above situation where the at least one first reflecting electrode, the at least one second reflecting electrode and the at least one third reflecting electrode are provided. In this case, the number of the at least one electrode layer, the number of the at least one first light-transmitting electrode layer, the number of the at least one second light-transmitting electrode layer and the number of the at least one third light-transmitting electrode layer may be set according to actual needs. That is, in the display substrate, the specific positions of the reflecting electrodes (e.g., first reflecting electrodes, second reflecting electrodes or third reflecting electrodes) in the sub-pixels with corresponding colors may be defined by forming different numbers of the at least one electrode layer, the at least one first light-transmitting electrode layer, the at least one second light-transmitting electrode layer and the at least one third light-transmitting electrode layer in the sub-pixels with different colors, so that it is convenient to reasonably set the reflection cavity length required by the light emitting portion in the sub-pixel with each color. Thus, in the display substrate manufactured by the manufacturing method described above, the light emitting efficiencies of the sub-pixels with different colors may be improved simultaneously by the reflecting electrodes, and the light emitting effect of the corresponding sub-pixel may be effectively controlled by using the distance between each reflecting electrode and the corresponding light emitting portion. In this way, the display color gamut of the display substrate may be adjusted appropriately, thereby effectively improving the color purity of the display device to which the display substrate is applied and improving the color display effect of the display device.

For example, the at least one electrode layer, the at least one first light-transmitting electrode layer, the at least one second light-transmitting electrode layer and the at least one third light-transmitting electrode layer are all light-transmitting electrode layers (e.g., electrode layers made of transparent conductive metal oxide). In this way, it is simple and convenient to manufacture, and it is advantageous to improve the mass production efficiency of the display substrate.

Figure 10:
FIG. 10 is a schematic diagram showing a structure of a display device, according to some embodiments of the present disclosure.

Some embodiments of the present disclosure provide a display device. With reference to FIG. 10, the display device 200 includes the display substrate according to any one of the above embodiments. Therefore, in the sub-pixels of the display device 200, the light emitted by the sub-pixels with corresponding different colors may be adjusted to different extents by the reflecting electrodes of the anodes. In this way, the display color gamut of the display device 200 may be adjusted appropriately, thereby effectively improving the color purity of the display device 200 and improving the color display effect of the display device 200.

For example, the display device 200 is a product or component having a display function, such as a mobile phone, a tablet computer, a television, a displayer, a laptop computer, a digital photo frame, or a navigator.

The foregoing description merely shows the specific implementations of the present disclosure, and the protection scope of the present disclosure is not limited thereto. Any person of skill in the art can readily conceive of variations or replacements without departing from the technical scope of the present disclosure, and these variations or replacements shall fall within the protection scope of the present disclosure. Therefore, the protection scope of the present disclosure shall be subject to the protection scope of the appended claims.

What is claimed is:

1. A display substrate, comprising:
    a base substrate; and
    a plurality of sub-pixels disposed on the base substrate, each sub-pixel including a light emitting device; wherein
    the light emitting device includes an anode, a cathode and a light emitting portion disposed between the anode and the cathode; the anode of the light emitting device is closer to the base substrate than the cathode of the light emitting device; the anode includes at least one first electrode and a reflecting electrode disposed on a side of the at least one first electrode configured to face a light emitting portion of the light emitting device; the reflecting electrode in the anode is configured to reflect light emitted by the light emitting portion; the cathode is configured to be light-transmittable;
    the plurality of sub-pixels include at least two types of sub-pixels, and each type of sub-pixels is configured to display a color; a distance between the reflecting electrode and the light emitting portion in each sub-pixel for displaying one color is different from a distance between the reflecting electrode and the light emitting portion in each sub-pixel for displaying another color;
    the at least two types of sub-pixels include: a red sub-pixel, a green sub-pixel, and a blue sub-pixel; a distance between the reflecting electrode and the light emitting portion in the blue sub-pixel is less than a distance between the reflecting electrode and the light emitting portion in the green sub-pixel; a distance between the reflecting electrode and the light emitting portion in the green sub-pixel is less than a distance between the reflecting electrode and the light emitting portion in the red sub-pixel.

2. The display substrate according to claim 1, wherein the anode further includes:
   at least one second electrode disposed on a side of the reflecting electrode away from the at least one first electrode;
   the at least one second electrode is configured to be light-transmittable.

3. The display substrate according to claim 2, wherein a material of the at least one second electrode includes transparent conductive metal oxide.

4. The display substrate according to claim 2, wherein
   the at least one first electrode includes a plurality of first electrodes disposed in a stack, or
   the at least one second electrode includes a plurality of second electrodes disposed in a stack, or
   the at least one first electrode includes a plurality of first electrodes disposed in a stack, and the at least one second electrode includes a plurality of second electrodes disposed in a stack.

5. The display substrate according to claim 1, wherein a material of the at least one first electrode includes at least one of metal or conductive metal oxide; and
   a material of the reflecting electrode includes at least one of silver, aluminum or molybdenum.

6. The display substrate according to claim 1, wherein along a direction that is perpendicular to the base substrate and points to the cathode from the anode of the light emitting device,
   in the light emitting device included in the blue sub-pixel, the at least one first electrode includes: blue first electrodes $A_{B1}$, $A_{B2}$ and $A_{B3}$, the reflecting electrode includes a blue reflecting electrode, and the light emitting device further includes a blue second electrode $B_{B1}$; and the blue first electrodes $A_{B1}$, $A_{B2}$ and $A_{B3}$, the blue reflecting electrode, and the blue second electrode $B_{B1}$ are disposed on the base substrate in sequence;
   in the light emitting device included in the green sub-pixel, the at least one first electrode includes: green first electrodes $A_{G1}$ and $A_{G2}$, the reflecting electrode includes a green reflecting electrode, and the light emitting device further includes: green second electrodes $B_{G1}$ and $B_{G2}$; and the green first electrodes $A_{G1}$ and $A_{G2}$, the green reflecting electrode, and the green second electrodes $B_{G1}$ and $B_{G2}$ are disposed on the base substrate in sequence; and
   in the light emitting device included in the red sub-pixel the at least one first electrode includes a red first electrode& $A_{R1}$, the reflecting electrode includes a red reflecting electrode, and the light emitting device further includes: red second electrodes $B_{R1}$, $B_{R2}$ and $B_{R3}$; and the red first electrodes $A_{R1}$, the red reflecting electrode, and the red second electrodes $B_{R1}$, $B_{R2}$ and $B_{R3}$ are disposed on the base substrate in sequence; wherein
   the red first electrode $A_{R1}$, the green first electrode $A_{G1}$ and the blue first electrode $A_{B1}$ are disposed in a same layer; the blue first electrode $A_{B2}$, the green first electrode $A_{G2}$ and the red second electrode $B_{R1}$ are disposed in a same layer; the blue first electrode $A_{B3}$, the green second electrode $B_{G1}$ and the red second electrode $B_{R2}$ are disposed in a same layer; and the blue second electrode $B_{B1}$, the green second electrode $B_{G2}$ and the red second electrode $B_{R3}$ are disposed in a same layer; and the blue first electrodes $A_{B2}$ and $A_{B3}$, the blue second electrode $B_{B1}$, the green first electrode $A_{G2}$, the green second electrodes $B_{G1}$ and $B_{G2}$, and the red second electrodes $B_{R1}$, $B_{R2}$ and $B_{R3}$ are all configured to be light-transmittable.

7. The display substrate according to claim 1, wherein the plurality of sub-pixels include at least two types of sub-pixels, and each type of sub-pixels is configured to display a color;
   light emitted by the light emitting portion in each sub-pixel for displaying one color and light emitted by the light emitting portion in each sub-pixel for displaying another color are different in color; or,
   light emitting portions in the sub-pixels for displaying different colors are all white light emitting portions, each sub-pixel further includes a color filter portion disposed above a side of the light emitting device away from the base substrate, and the color filter portion in each sub-pixel for displaying one color and the color filter portion in each sub-pixel for displaying another color are different in color.

8. A display device, comprising the display substrate according to claim 1.

9. The display substrate according to claim 1, wherein an orthographic projection of the reflecting electrode on a reference plane is at least partially overlapped with an orthographic projection of the light emitting portion on the reference plane, the reference plane being parallel to a surface of the at least one first electrode configured to face the light emitting portion.

10. A method of manufacturing a display substrate, comprising:
   providing a base substrate;
   forming a plurality of anodes on a side of the base substrate; and
   forming a plurality of light emitting portions on sides of the plurality of anodes away from the base substrate, respectively; wherein
   forming the plurality of anodes on the side of the base substrate, includes:
   forming at least one electrode layer on a side of the base substrate, each electrode layer including a plurality of first electrodes; and
   forming a first reflecting electrode layer on a side of the at least one electrode layer away from the base substrate, the first reflecting electrode layer including at least one first reflecting electrode, an orthographic projection of one first reflecting electrode on the base substrate being at least partially overlapped with an orthographic projection of a corresponding one of the plurality of light emitting portions on the base substrate; wherein
   forming the plurality of anodes on the side of the base substrate, further includes:
   forming at least one first light-transmitting electrode layer on the base substrate with the at least one electrode layer and the first reflecting electrode layer formed thereon, each first light-transmitting electrode layer including a plurality of first light-transmitting electrodes, an orthographic projection of each of the plurality of first light-transmitting electrodes on the base substrate being at least partially overlapped with an orthographic projection of a corresponding one of the plurality of first electrodes on the base substrate.

11. The method according to claim 10, wherein forming the plurality of anodes on the side of the base substrate, further includes:

forming a second reflecting electrode layer on a side of the at least one first light-transmitting electrode layer away from the base substrate, the second reflecting electrode layer including at least one second reflecting electrode, an orthographic projection of one second reflecting electrode on the base substrate being at least partially overlapped with an orthographic projection of a corresponding one of the plurality of light emitting portions on the base substrate, and an orthographic projection of each second reflecting electrode on the base substrate being not overlapped with an orthographic projection of any one first reflecting electrode on the base substrate; and forming at least one second light-transmitting electrode layer on a side of the second reflecting electrode layer away from the base substrate, each second light-transmitting electrode layer including a plurality of second light-transmitting electrodes, an orthographic projection of each of the plurality of second light-transmitting electrodes on the base substrate being at least partially overlapped with an orthographic projection of a corresponding one of the plurality of first electrodes on the base substrate.

12. The method according to claim 11, wherein forming the plurality of anodes on the side of the base substrate, further includes:

forming a third reflecting electrode layer on a side of the at least one second light-transmitting electrode layer away from the base substrate, the third reflecting electrode layer including at least one third reflecting electrode, an orthographic projection of one third reflecting electrode on the base substrate being at least partially overlapped with an orthographic projection of a corresponding one of the plurality of light emitting portions on the base substrate, and an orthographic projection of each third reflecting electrode on the base substrate being not overlapped with the orthographic projections of any one first reflecting electrode and any one second reflecting electrode on the base substrate; and forming at least one third light-transmitting electrode layer on a side of the third reflecting electrode layer away from the base substrate, each third light-transmitting electrode layer including a plurality of third light-transmitting electrodes, an orthographic projection of each of the plurality of third light-transmitting electrodes on the base substrate being at least partially overlapped with an orthographic projection of a corresponding one of the plurality of first electrodes on the base substrate.

13. The method according to claim 12, wherein the base substrate includes at least one red sub-pixel region, at least one green sub-pixel region and at least one blue sub-pixel region, each red sub-pixel region being configured to be provided with a red sub-pixel, each green sub-pixel region being configured to be provided with a green sub-pixel, each blue sub-pixel region being configured to be provided with a blue sub-pixel; wherein the at least one first reflecting electrode is disposed in the at least one red sub-pixel region, respectively;

the at least one second reflecting electrode is disposed in the at least one green sub-pixel region, respectively; and the at least one third reflecting electrode is disposed in the at least one blue sub-pixel region, respectively.

14. The method according to claim 12, wherein the at least one electrode layer, the at least one first light-transmitting electrode layer, the at least one second light-transmitting electrode layer and the at least one third light-transmitting electrode layer are formed by sputtering.

15. The method according to claim 12, wherein the first reflecting electrode layer, the second reflecting electrode layer and the third reflecting electrode layer are formed by printing or sputtering.

* * * * *